United States Patent [19]
Ruble, III

[11] Patent Number: 5,956,925
[45] Date of Patent: Sep. 28, 1999

[54] CARRIER TAPE AND METHOD FOR WASHING OF COMPONENTS IN CARRIER TAPE

[75] Inventor: Robert Raymond Ruble, III, Spring Grove, Ill.

[73] Assignee: BMI, Inc., Palatine, Ill.

[21] Appl. No.: 09/002,221

[22] Filed: Dec. 31, 1997

[51] Int. Cl.$^6$ .................................................... B65B 55/00
[52] U.S. Cl. ........................... 53/428; 53/111 R; 53/399; 53/591; 134/151; 134/25.4; 206/347; 206/716
[58] Field of Search ........................... 53/111 R, 111 RC, 53/399, 428, 591; 134/15, 25.4, 151, 153; 206/713, 714, 716, 347

[56] References Cited

U.S. PATENT DOCUMENTS

| | | | |
|---|---|---|---|
| 4,218,578 | 8/1980 | Olschewski et al. . | |
| 4,296,769 | 10/1981 | van der Lugt | 134/151 X |
| 4,575,995 | 3/1986 | Tabuchi et al. | 53/591 |
| 4,754,101 | 6/1988 | Stickney et al. . | |
| 4,759,466 | 7/1988 | Chase et al. . | |
| 4,838,475 | 6/1989 | Mullins et al. . | |
| 4,905,445 | 3/1990 | Saitoh et al. | 53/54 |
| 5,005,338 | 4/1991 | Kemkers et al. | 53/54 X |
| 5,014,160 | 5/1991 | McCoy et al. . | |
| 5,095,177 | 3/1992 | Johnson . | |
| 5,131,206 | 7/1992 | Sillner | 53/54 |
| 5,160,807 | 11/1992 | Frey et al. . | |
| 5,175,395 | 12/1992 | Moore . | |
| 5,234,104 | 8/1993 | Schulte et al. | 206/714 |
| 5,259,500 | 11/1993 | Alvite et al. | 206/714 |
| 5,265,723 | 11/1993 | Chenoweth et al. | 206/714 |
| 5,333,733 | 8/1994 | Murata | 206/820 X |
| 5,353,201 | 10/1994 | Maeda . | |
| 5,354,951 | 10/1994 | Lange, Sr. et al. . | |
| 5,434,747 | 7/1995 | Shibata . | |
| 5,495,399 | 2/1996 | Gore et al. . | |
| 5,524,765 | 6/1996 | Gutentag | 206/713 |
| 5,541,811 | 7/1996 | Henningsson et al. . | |
| 5,559,676 | 9/1996 | Gessaman . | |
| 5,565,656 | 10/1996 | Mottahed . | |
| 5,566,052 | 10/1996 | Hughes . | |
| 5,613,343 | 3/1997 | Inoue et al. | 53/591 X |
| 5,614,694 | 3/1997 | Gorenz, Jr. et al. . | |
| 5,633,786 | 5/1997 | Matsuzewski et al. . | |
| 5,706,952 | 1/1998 | Bianca et al. | 206/716 X |
| 5,747,718 | 5/1998 | Bill et al. | 53/591 X |

*Primary Examiner*—Daniel B. Moon
*Attorney, Agent, or Firm*—Richard A. Zachar

[57] ABSTRACT

A carrier tape suitable for facilitating in-line washing of components for use in pick-and-place operations. The components are loaded into their respective pockets after emerging from one or more forming machines, with the components having lubricant remaining thereon, and are placed into respective pockets of the carrier tape with lubricant remaining on the components. The carrier tape has a plurality of pockets for receiving respective components, with the pockets having washing openings through which cleaning fluid is imparted to the components and allowed to drain from the pockets as the pockets are passed through washing and drying stations. After being washed and dried, a cover strip is detachably adhered to the carrier tape to maintain the components in their respective pockets.

5 Claims, 3 Drawing Sheets

CARRIER TAPE AND METHOD FOR WASHING OF COMPONENTS IN CARRIER TAPE

FIELD OF THE INVENTION

The present invention pertains to carrier tapes for storage of components and supplying those components seriatim to a machine, and more particularly pertains to such carrier tape and method for in-line washing of components while disposed within the carrier tape.

BACKGROUND OF THE INVENTION

Carrier tapes are a well known means for storing components for transport of the components from a component manufacturer to a different manufacturer that assembles the components into a new product. The components may be any of a wide variety of components. Such carrier tapes typically comprise an elongated strip portion having a plurality of longitudinally aligned pockets each of which receives a respective component, with a tape portion sealingly engaged to the strip portion and extending over the pockets to maintain the components within their respective pockets.

In a typical production operation, the components may be, for instance, metallic shields for utilization on a circuit board for shielding one or more electronic components. Such components are formed in one or more machines which utilize machining lubricants and oils in the forming process. After a plurality of such components are formed, they are accumulated in a washing bin and batch washed together to remove the machining lubricants. After being batch washed, the components are batch dried and then loaded into a vibratory bowl for separating the cleaned components into a single row for loading the cleaned components seriatim into respective pockets of the carrier tape. A pinhole is provided in the bottom of each pocket through which an optical scanner passes to confirm the presence of the component in the pocket. Only upon such optical confirmation is the carrier tape then advanced. Thereafter, a tape portion is sealingly engaged to the strip portion, extending over the pocket openings, to secure the components in their respective pockets, and the carrier tape is then wound onto a reel.

There are several shortcomings associated with this current production method, a particular one of which is the requirement for off-line batch washing of the components following machining operations and prior to loading the components into the pockets of the tape portion. In addition to the man-hours required to be expended in the batch washing operations and the capital costs required to be expended in purchasing, maintaining and utilizing a vibratory bowl separator, the batch washing and vibratory bowl separating operations impose a significant limitation in the production rate.

Accordingly, there is a need for an improved way to get the components having machining oil thereon loaded into respective carrier strip pockets and free from the machining oil, which does not require batch washing or vibratory bowl separators, and which allows for significantly increased production rates as compared to currently employed methods.

SUMMARY OF THE INVENTION

In accordance with the present invention, a carrier tape is provided which allows for washing and drying of the components while disposed within the carrier tape, thereby allowing for the elimination of batch washing operations and vibratory feeder bowls. In accordance with one aspect of the present invention, a flexible carrier tape for storage and delivery of components is provided, comprising a strip portion having a top surface, and a bottom surface, with a plurality of pockets formed in the strip portion and spaced along the strip portion for receiving and carrying respective ones of the components. Each of the pockets has an upper removal opening through the top surface which upper opening is larger than the component received in the pocket to allow removal of the component from the pocket through the upper opening. Each pocket has a lower washing opening through the bottom surface which lower washing opening is smaller than the component disposed in the pocket, or otherwise configured, to maintain the components in their respective pockets, and prevent the components from being pushed through the lower washing openings, but with the lower washing opening being sufficiently large, or otherwise configured, to allow washing and drying of the component through the lower opening while the component is disposed within the pocket.

In accordance with another aspect of the present invention, a method for producing a carrier tape having cleaned, washed components disposed therein is provided in which the method comprises forming components in one or more forming machines, at least one of which forming machines utilizes machining lubricant; providing a strip portion of a carrier tape having a top surface, a bottom surface, and a plurality of pockets formed in the strip portion and spaced along the strip portion for receiving and carrying respective ones of the components; and washing at least a substantial portion of the machining lubricant from the components, while the components are maintained within their respective pockets.

BRIEF DESCRIPTION OF THE DRAWINGS

In the drawings, wherein like elements are referenced alike.

DETAILED DESCRIPTION OF THE PREFERRED EMBODIMENTS

Figure 1:
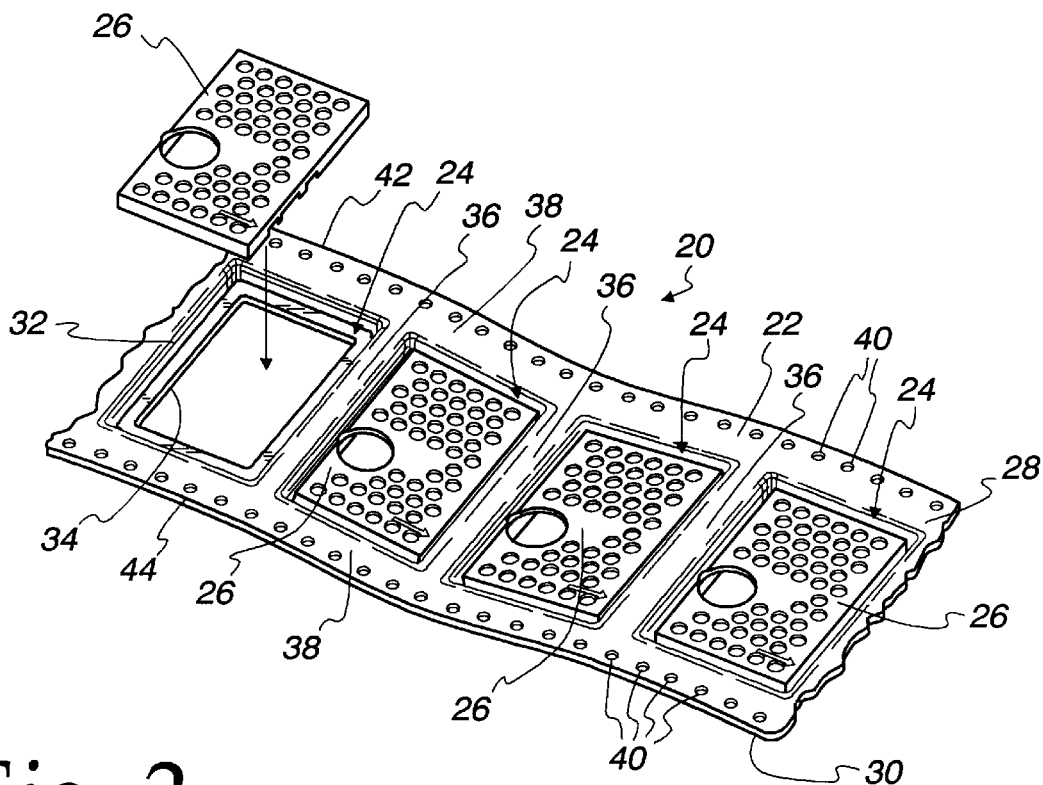
FIG. 1 is a partial perspective view of a carrier tape embodying various features of the present invention, shown with components disposed in respective pockets.
Figure 2:
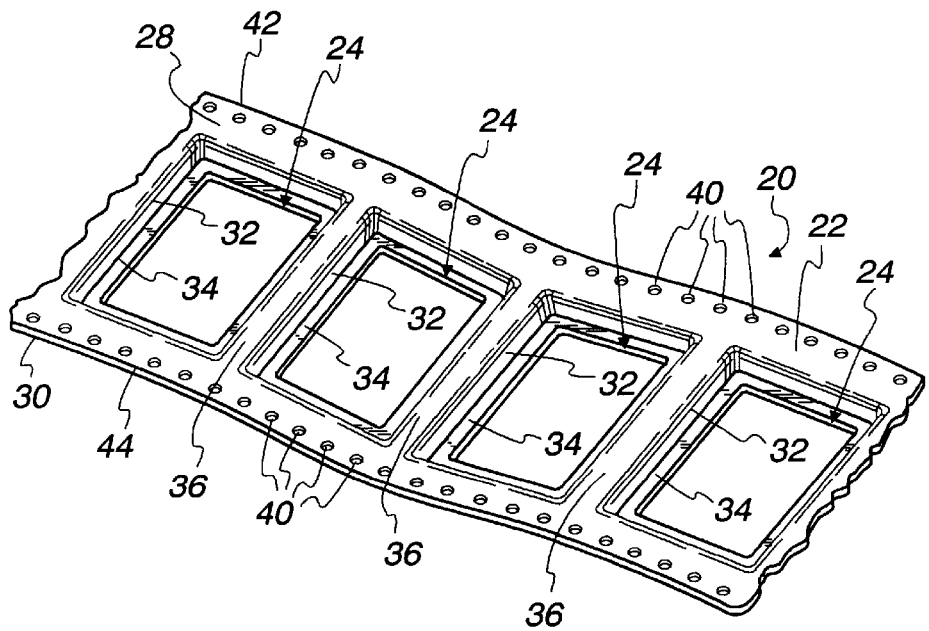
FIG. 2 is a partial perspective view of the carrier tape of FIG. 2, shown without components disposed therein.

Carrier tape embodying various features of the present invention is illustrated in FIGS. 1–2 and 4–7 and referred to generally by reference numeral 20. The carrier tape 20 has a longitudinally extending carrier strip portion 22 which defines a plurality of longitudinally disposed pockets 24, each for receiving a respective component 26. The carrier strip 22 has an upper surface 28 and a lower surface 30. The upper surface 28 has removal openings 32 at each of the pockets 24 which removal openings 32 are larger than the respective components 26 disposed in the pockets 24, to allow unimpeded removal of the components from the pockets 24 through their respective removal openings 32 for pick-and-place operations and the like. The lower surface 30 has washing openings 34 at each of the pockets 24, which washing openings are smaller than the respective components 26 disposed in the pockets 24 or otherwise configured to prevent passage of the components 26 through their respective washing openings 34, but sufficiently large to allow washing, and preferably both washing and drying, of components 26 disposed within their respective pockets 24 through the washing openings 34, as explained in greater detail below. Each pocket 24 preferably extends downwardly from the upper surface 28 of the strip portion 22 an amount sufficient to accommodate the height of the component 26 to be received in the pocket 24, whereby the entire component 26 is disposed beneath the upper surface 28 of the strip portion 22 when the component 26 is disposed within its respective pocket 24. The periphery of each pocket 24 is bounded by pocket walls 36 which maintain separation of the components 26 disposed in one pocket 24 from the components 26 disposed in adjacent pockets 24.

The upper surface 28 of the strip portion 22 of the carrier tape 20 extends beyond or wider than the pockets 24 to provide drive engaging portions 38 for engaging and facilitating advancements of the carrier strip 22. In the illustrated embodiment, the drive engaging portions 38 are provided on opposite sides 42 and 44 of the strip portion 22 and extend the length of the strip 22, with longitudinally disposed sprocket engaging holes 40 provided therein for receiving sprockets of a strip advancing mechanism. It will be readily apparent to those skilled in the art that the disclosed advancing mechanism is illustrative only, and the invention is not limited in any way to sprocket-type drives, and the invention lends itself to use with a wide variety of other drive arrangements and structures which will be readily apparent to those skilled in the art. Such drive arrangements and structures may include drive engaging portions on one or both sides of the strip portion 22, or may not require utilization of any strip portion 22.

Accordingly, with the carrier strip portion 22 of the carrier tape 20 thus far described, components 26, which may be unwashed following machining or forming and may therefore have machining lubricant remaining thereon, are loaded into respective pockets 24. The components 26 disposed in respective pockets 24 are accessible to cleaning fluids and solutions through one or both of their lower washing opening 34 and upper removal opening 32. The components 26 are held in their respective pockets 24 of the carrier tape 20 by any suitable means as they are advanced through washing and drying operations, to retain the components within their respective pockets against the forces associated with washing and drying, such as water jets and air streams.

After the components have been advanced through the washing and drying stations, a cover strip 46 is detachably adhered to the upper surface 28 of the strip portion 22 and extending over the upper removal openings of each of the pockets 24 to maintain the components 26 in their respective pockets 24. The cover strip 46 is preferably transparent to allow viewing of the components 26 while they are disposed within their respective pockets 24. The cover strip 46 also preferably extends from one drive engaging portion 38 to the other drive engaging portion 38 to completely cover the upper removal openings, and terminates prior to the sprocket engaging holes 40 to prevent interference of the cover strip 46 with the sprockets and advancement of the carrier tape 20. The fully formed carrier tape 20 with cleaned and dried components 26 therein is then wound onto a reel 48, and ready for shipment to a user and subsequent utilization of the carrier tape 20. At the time of desired usage, the carrier tape 20 is unwound from the reel 48 and the cover strip 46 peeled back from the strip portion 22 of the carrier tape 20 to allow unimpeded removal of the components 26 from their respective pockets 24 through the removal openings 32, such as by automated pick-and-place devices.

The strip portion 22 of the carrier tape 20 is preferably produced by forming one or more washing openings 34 of predetermined size and configuration in a flat strip of plastic material, and then vacuum forming or drawing down predetermined regions of the plastic strip to form a plurality of pockets 24 and thereby defining the upper and lower surfaces 28 and 30. Manifestly, any of a wide variety of other methods for forming the strip portion 2 are well known and may be employed to form the strip portion 22.

The carrier tape 20 of the present invention lends itself particularly well to utilization with pick-and-place devices. Such pick-and-place devices typically have one or more arms with suction cups for lifting or picking up components and placing the lifted components onto a substrate such as a circuit board in a desired location. During the pick-and-place operations, the carrier tape 20 is typically oriented with its upper surface 28 facing upwardly and its lower surface facing downwardly. The suction cups enter the pockets 24 through the removal openings, from the upper surface side of the carrier tape 20, and push the components 26 against the bottom of their respective pockets 24, at which the washing openings 34 are disposed. It is desired that the washing openings 34 be configured to prevent the components 26 from being pushed through the washing openings 34 by the force of the suction cups.

In prior art carrier strips, a pinhole-sized aperture is provided in the bottom of each pocket for the purpose of allowing an optical scanner to confirm the presence of a component in a pocket. However, the pinholes have never been used for facilitate cleaning of components while disposed in the carrier tape, and the pinholes are insufficiently sized for allowing either washing of the components through the pinholes or drying of components within a sufficiently short length of time, should such in-line washing in accordance with the present invention have been attempted using this prior art carrier tape.

Figures 5, 6, 7:
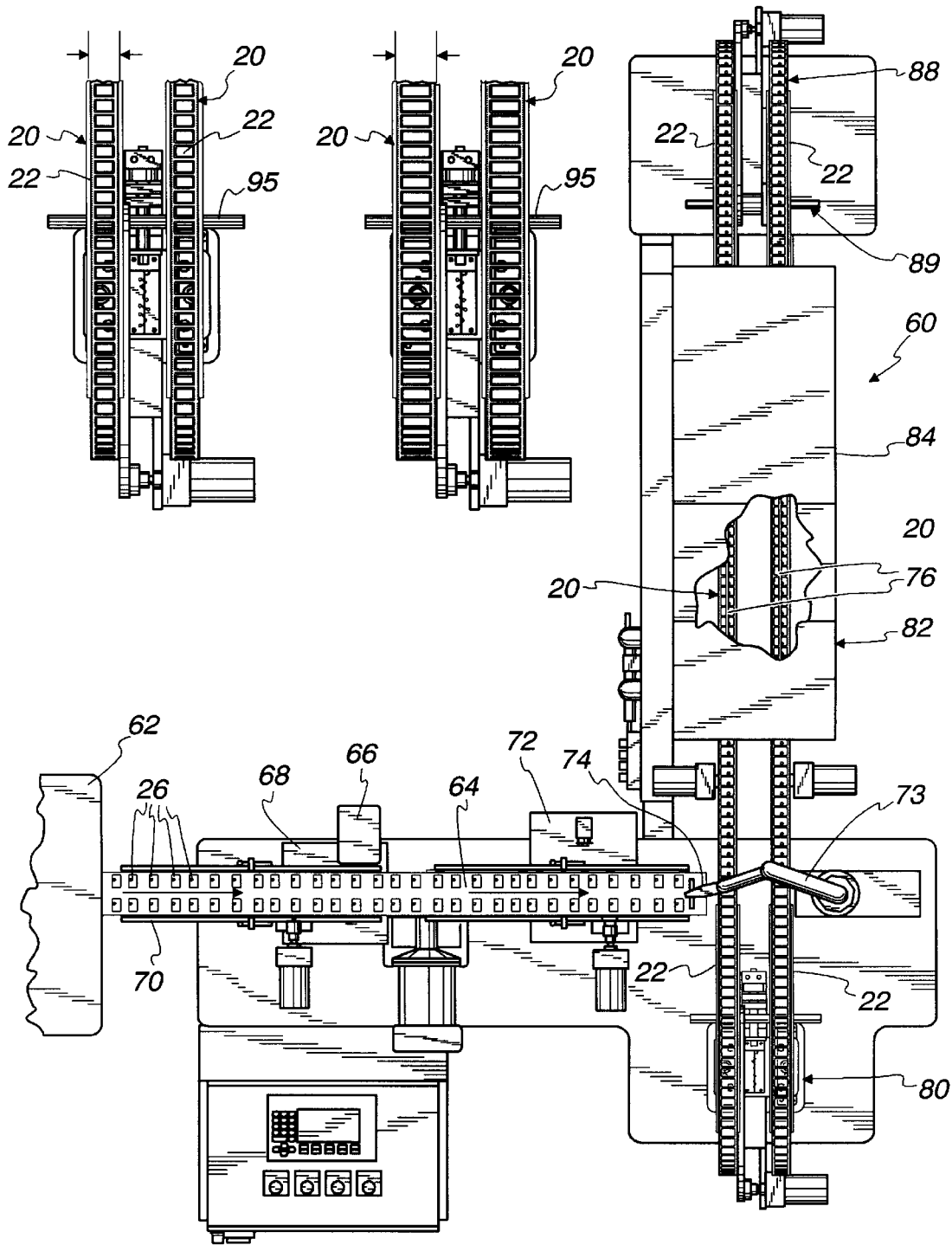
FIG. 5 is a plan view of an apparatus embodying various features of the present invention.
FIG. 6 is an enlarged partial view of the pair of carrier tapes on the apparatus of FIG. 5.
FIG. 7 is an enlarged partial view of a pair of carrier tapes which are wider than the carrier tapes of FIG. 6, illustrating the adaptability of the apparatus to accommodate various sized carrier tapes.

An apparatus for carrying out various aspects of the present invention is illustrated in FIG. 5 and referred to generally by reference numeral 60. The apparatus 60 is for use in conjunction with one or more forming machines 62, such as forming presses, stamping machines, and the like, at least one of which utilizes machining lubricant, whereby the component exiting the forming machines 62 has machining lubricant remaining thereon. Machining lubricant on the components is undesirable in many applications. For instance, in EMI/RFI shields, machining lubricant remaining on the components may interfere with soldering of the components to a circuit board. The apparatus has a conveyor system, such as the conveyor belt 64, onto which the lubricant-soiled components 26 are received following their exit from the forming machines 62. The components 26 are transported on the conveyor 64 into registration with a first inspection camera 66 which scans the components to verify the correct length, width and orientation of the components 26. A side shuttle 68 reciprocates toward and away from the components passing past the side shuttle 68 to push or slide the components across the conveyor 64 against a stationary wall 70 to squarely align the components 26. The components 26 are then transported on the conveyor 64 into registration with a second inspection camera 72 which scans the components 26 to verify that the components meet predetermined flatness tolerances.

Those components 26 which pass the first and second camera inspections are then picked up off of the conveyor by an arm 73 having a suction cup 74 and placed in respective pockets 24 of the strip portion 22 of the carrier tape 20. As is well known in the art, the suction cups 74 draw air in, or create a vacuum, during picking up of components 26 to assure adequate engagement of the components with the suction cups, and the drawing in of air is halted to release the component at a desired location. The suction cup arm 73 may be made rotary to allow rotation of the components 26 to a desired, common orientation. The strip portion 22 of the carrier tape 20 is then advanced beneath one or more retaining members 76 which extend over the removal openings 32 to temporarily hold the components 26 within their respective pockets 24 as the strip portion 22 carrying the components 26 is advanced through washing and drying stations. This serves to prevent the components 26 from being pushed out of their respective pockets under the force of the water and air streams imparted to the components in the washing and drying stations. As mentioned above and described in greater detail below, after the components 26 have been washed and dried, a cover strip 46 is detachably sealingly engaged to the strip portion 22 and serves to maintain the components 26 within their respective pockets 24. However, since the cover strip 46 is not attached until after the washing and drying operations, the retaining members 76 are provided to hold the components 26 in their respective pockets 24 prior to the cover strip 46 being applied. In this regard, it is appreciated that the cover strip 46 may be engaged to the strip portion 22 prior to the washing and drying operations so that the cover strip 46 serves to maintain the components 26 within their respective pockets 24 during washing and drying operations; however, it is preferred that the cover strip be applied subsequent to washing and drying operations.

Accordingly, with reference to FIG. 5, a length of strip portion 22 is unwound from its reel by a de-reeler 80 and passes into registration with the aforementioned pick-and-place suction cup 74, whereat the suction cup 74 places the lubricant soiled components which it has picked up from the conveyor 64 into respective pockets 24 of the strip portion 22. The strip portion 22 may be intermittently advanced or continuously advanced, depending upon the selected arrangement, and both types of systems are considered well within the level of ordinary skill in the art and therefore not elaborated herein.

Figure 4:
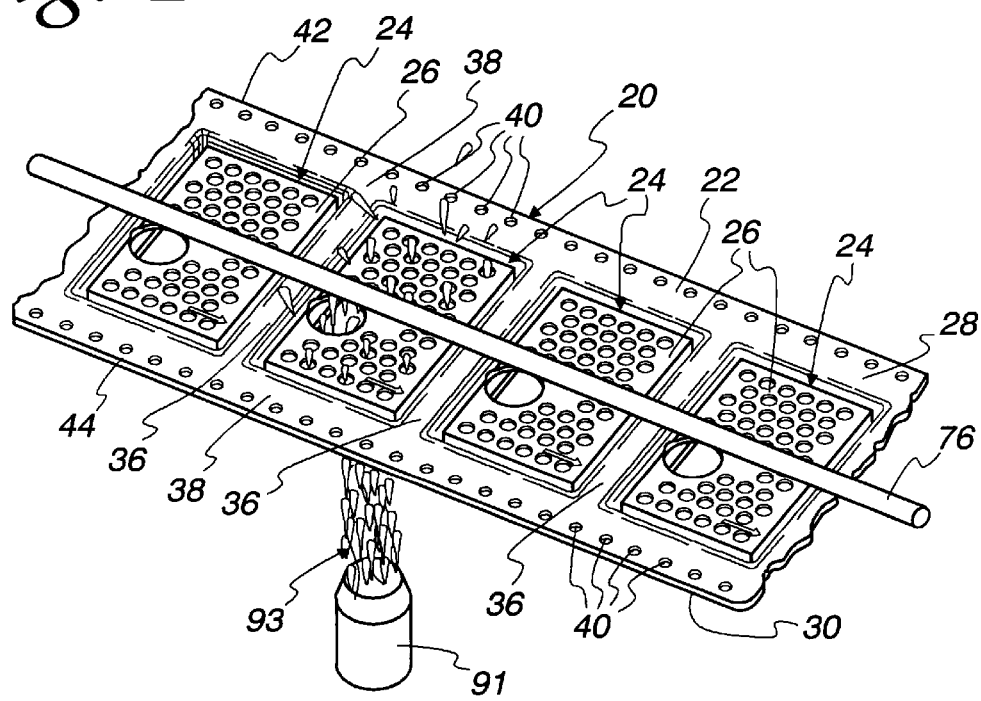
FIG. 4 is a partial perspective view of the carrier tape of FIG. 2, illustrating the components being washed through the lower washing opening while held in their respective pockets.

The strip portion 22, with lubricant soiled components 26 now in respective pockets 24, is advanced through a washing station 82 at which the components 26 are sprayed with water, detergents and/or cleaning agents through the washing openings 34 in the lower surface 30 of the strip portion 22, to wash at least a substantial portion of the machining lubricant from the components 26. The washing station 82 may have any of various arrangements suitable for washing components, including single or multiple jets or cleaning fluids and water, and by illustrative example the washing station 82 may comprise cleaning fluid jets, followed by a first rinse and then a second rinse. The cleaning fluid jets, as well as the rinse jets, may be imparted to the components 26 from the lower surface side of the strip portion 22 through the washing openings 34, or from both above and below through both the washing openings 34 and the removal openings 32. A representative jet 91 imparting a spray 93 to the component through the washing opening 34 of the carrier strip 22 is illustrated in FIG. 4; however, it will be readily apparent to those skilled in the art that the invention is not limited to jets such as the jet 91 which is provided for general illustrative purposes only.

The strip portion 22, with washed components 26 in respective pockets 24, then continues its advancement through a drying station 84 at which the components 26 are subjected to drying air, preferably in the form of heated air jets and/or convection through the washing openings 34 and/or removal openings 32. The drying station 84 also dries the strip portion 22 to allow adhesion of materials, such as a cover strip 46, to the carrier strip following the drying station 84.

After the components 26 in the strip portion 22 have passed through the drying station, and are now dried sufficiently, the strip portion 22 carrying cleaned and dried components 26 is then advanced to a cover strip sealing station 89 at which a cover strip 46 is detachably adhered to the upper surface 28 of the strip 22 to seal the components 26 in their respective pockets 24. The carrier tape 20 thus formed is then wound by a re-reeler onto a take-up reel 88 for future usage, such as being shipped to a manufacturing facility for use with pick-and-place apparatus.

In the illustrated embodiment, the apparatus 60 utilizes two strip portions 22 simultaneously. The components 26 coming from the forming machines 62 are preferably alternately picked and placed in pockets of one strip portion 22 and then the other strip portion 22. The two strip portions 22 are both advanced, either together or alternately, through the washing and drying stations and reeled onto respective reels 88. Manifestly, any number of strip portions 22 may be passed through the washing and drying stations at a given time, and the invention is not limited to embodiments utilizing only one or two strip portions 22 at one time.

Utilizing the carrier tape 20 of the present invention and the in-line washing taught by the present invention, batch washing and its associated shortcomings may be eliminated. Amongst the shortcomings associated with batch washing, which shortcomings are overcome by the present invention, is damage to components which occurs during batch washing due to the components impacting and scraping against one another. By washing each of the components while they are disposed in their separate respective pockets 24, detrimental contact between the components is eliminated. This is particularly important in applications requiring precision tolerances of components. With the teachings of the present invention, the tolerances of the components are not significantly affected by washing of the components.

Also, since the components are loaded into pockets of the carrier tape 20 as the components come off of the forming machine, the need to purchase, utilize and maintain a vibratory bowl feeder or the like to separate the batch of components into a single file or row for pick-and-placing of the components is eliminated. This represents a significant cost reduction over batch washing, which cost reduction is above and beyond the savings realized by eliminating batch washing equipment, batch washing personnel, and increased production rates realized with the present invention.

Additionally, since the components 26 are loaded into pockets of the carrier tape 20 as the components come off of the forming machine, the need to maintain an inventory of components for future loading into carrier tapes 20 is eliminated, and therefore the requirement of maintaining an inventory of the components is eliminated.

Figure 3:
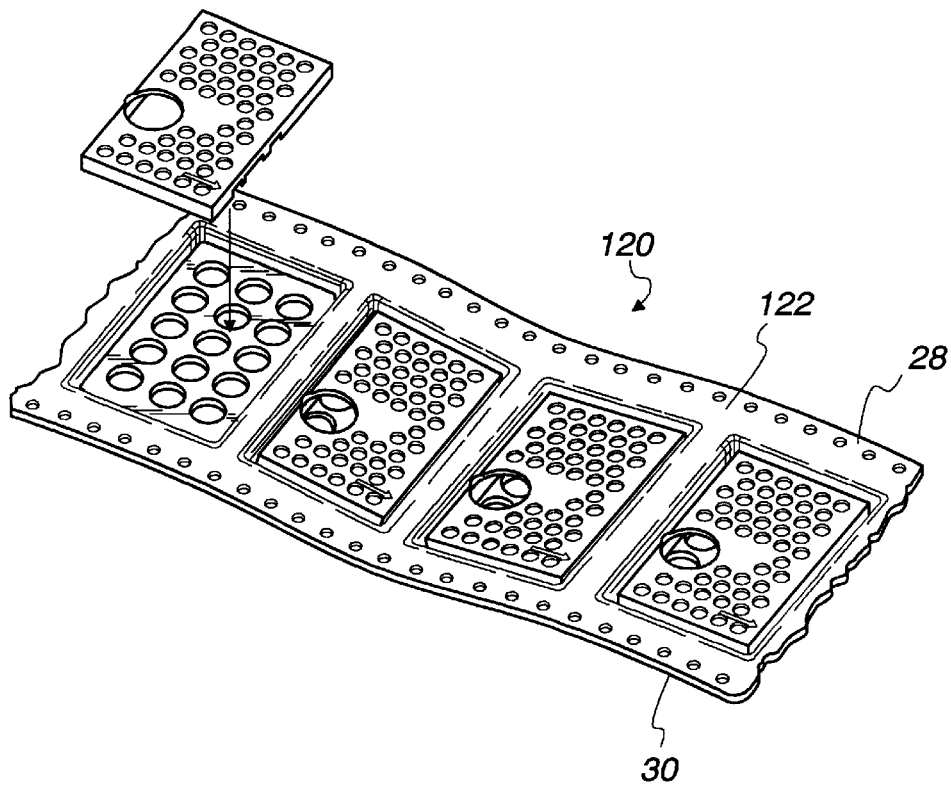
FIG. 3 is a partial perspective view of another carrier tape embodying various features of the present invention, shown with components disposed in respective pockets.

In the illustrations and description herein, the components 26 are EMI/RFI shields, such as those disclosed in U.S. Pat. No. 4,838,475 which is incorporated by reference as if fully reproduced herein. However, manifestly the invention is not limited to utilization with the disclosed EMI/RFI shield, and the invention lends itself to utilization with any of an infinite number of various parts and components, as well as pre-assemblies. Likewise, although the washing openings 34 are illustrated as being a single, generally rectangular opening, this is only by way of example and the invention is not limited in this regard. As will be readily apparent to those skilled in the art, the washing openings 34 may comprise any of an infinite number of shapes and configurations such as a plurality of round holes disposed in the lower side 30 of the carrier strip 22 (see FIG. 3), a plurality of elongated slits, or any other shape or combination of shapes which provides an overall opening sufficiently large to allow washing and drying of the components disposed in respective pockets within a reasonable distance of travel, whereby the apparatus may be contained within a reasonable amount of production facility floor space.

In accordance with another aspect of the present invention, the apparatus of the present invention lends itself to accommodation of various widths of strip portions 22. It is desirable that the strip portion driving mechanism preferably accommodate various widths of strip portions 22.

In an in-line washing arrangement in which the components are washed and dried while being transported from the forming machines, such as by a conveyor, and prior to the components being placed in pockets 24 of the strip portion 22, it is quite difficult to accommodate various sizes of components. That is, considerable expense is required to be expended for equipment suitable for this type of in-line washing arrangement in order to accommodate (i.e. handle, orient, etc.) the desired wide variety of component sizes and shapes. However, in the illustrated embodiment, the sprockets (not shown) which drive the carrier strip 22 are displacable to selective positions along the sprocket shaft 95 to accommodate any width of strip portion 22. By using the strip portion 22 of the carrier tape 20 of the present invention and washing the components 26 while they are disposed in respective pockets of the strip portion 22, one may use only a few different widths of strip portions 22, preferably conforming to Electronic Industries Association (EIA) specifications, with differently sized and shaped pockets to accommodate a very wide variety of sizes and shapes of components relatively inexpensively. For instance, the EIA has set forth some standard width sizes for conventional carrier tape, e.g. 32 mm., 44 mm., and 56 mm. The present invention allows the in-pocket washing of a virtually limitless variety of sizes and shapes of components while using only the limited number of different EIA standard sizes.

For instance, in order to handle triangular-shaped components for some runs, rather than rectangular shaped components which are typically run, conventional wisdom would dictate that in-line washing of components, i.e. washing and drying of the components after coming out of the forming machines but prior to being placed into pockets of the strip portion 22, would require a considerable changeover in its equipment to handle the triangular-shaped pieces. However, by employing the carrier tape 20 and method in accordance with present invention, in which the components are washed and dried while disposed in their respective pockets 24, the only significant changeover required is to change to a carrier tape having suitably sized and shaped triangular pockets.

What is claimed is:

1. A method for producing a carrier strip having cleaned components disposed therein, the method comprising:

forming said components in one or more forming machines, at least one of which forming machines utilizes machining lubricant;

providing a strip portion of a carrier strip having a top surface, a bottom surface, a plurality of pockets formed in the strip portion and spaced along the strip portion for receiving and carrying respective ones of said components, with said plurality of pockets each having an upper removal opening through the upper surface to allow removal of the components from their respective pockets through said upper openings for automated pick-and-place operations, and said plurality of pockets each having a washing opening through the bottom surface;

inserting the formed components, having machining lubricant thereon from the forming machines, into respective pockets of the strip portion; and washing at least a substantial portion of the machining lubricant from the components while the components are maintained within their respective pockets, through the washing opening in the strip portion.

2. A method in accordance with claim 1 in which the components are maintained in their respective pockets during said washing by an element which overlaps the upper openings of a plurality of said pockets.

3. The method of claim 1 further including engaging a removable cover strip to the top side of the carrier strip to maintain the components in their respective pockets.

4. The method of claim 1 further including drying the components while the components are maintained within their respective pockets.

5. An apparatus for use with one or more forming machines, at least one of which utilizes machining lubricant, for producing a sealed carrier strip having cleaned components therein, the apparatus comprising:

a carrier strip advancement device for advancing a strip portion of the carrier strip, having a top surface, a bottom surface, a plurality of aligned pockets formed in the strip portion and spaced along the strip portion for receiving and carrying respective ones of said components, with each of said plurality of pockets having an upper opening through the top surface which upper opening is larger than the component received in the respective pocket to allow removal of the components from their respective pockets through said upper openings for automated pick-and-place operations, and said plurality of pockets each having a washing opening through the bottom surface;

a component loading device for loading the components output from said one or more forming machines into respective pockets of the strip portion, with the components having said machining lubricant remaining thereon; and a washing device for washing the components through the washing openings in the bottom of their respective pockets to remove at least a substantial portion of the machining lubricant from the components while the components remain in their respective pockets.

\* \* \* \* \*